United States Patent
Sugahara

(10) Patent No.: US 12,080,447 B2
(45) Date of Patent: Sep. 3, 2024

(54) WIRE HARNESS INCLUDING CONNECTOR HAVING VACANT CAVITY

(71) Applicant: SUMITOMO WIRING SYSTEMS, LTD., Mie (JP)

(72) Inventor: Kenji Sugahara, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 132 days.

(21) Appl. No.: 17/792,242

(22) PCT Filed: Jan. 7, 2021

(86) PCT No.: PCT/JP2021/000260
§ 371 (c)(1),
(2) Date: Jul. 12, 2022

(87) PCT Pub. No.: WO2021/149494
PCT Pub. Date: Jul. 29, 2021

(65) Prior Publication Data
US 2023/0049348 A1    Feb. 16, 2023

(30) Foreign Application Priority Data

Jan. 20, 2020  (JP) ................. 2020-006542

(51) Int. Cl.
*H01B 7/00*    (2006.01)
*B60R 16/02*   (2006.01)
(Continued)

(52) U.S. Cl.
CPC ........... *H01B 7/0045* (2013.01); *G01R 31/54* (2020.01); *H01B 7/20* (2013.01); *H01B 7/228* (2013.01);
(Continued)

(58) Field of Classification Search
None
See application file for complete search history.

(56) References Cited

U.S. PATENT DOCUMENTS 4,662,067 A * 5/1987 Abraham ............... H01R 9/053
29/749
5,281,150 A * 1/1994 Bundga ................. H01R 12/62
439/497
(Continued)

FOREIGN PATENT DOCUMENTS

CN  109643869 A * 4/2019 ............. H01R 13/52
JP  H04-335170 A  11/1992
(Continued)

OTHER PUBLICATIONS

International Search Report issued on Mar. 23, 2021 for WO 2021/149494 A1 (6 pages).

Primary Examiner — Timothy J. Dole
Assistant Examiner — Muhammed Azam
(74) Attorney, Agent, or Firm — Venjuris, P.C.

(57) ABSTRACT

A wire harness according to one aspect of the present disclosure includes: a first wire harness that includes a first electric wire, a first shielding member, and a first connector; a second wire harness that includes a second electric wire, a second shielding member, and a second connector; and a connection member that electrically connects a drain wire of the first shielding member and a drain wire of the second shielding member to each other. A drain wire drawn out from an end portion of the first shielding member on the first connector side is grounded. A drain wire drawn out from an end portion of the second shielding member on the second connector side is inserted into a vacant cavity of the second connector.

5 Claims, 4 Drawing Sheets

(51) Int. Cl.
  *G01R 31/54*  (2020.01)
  *H01B 7/20*   (2006.01)
  *H01B 7/22*   (2006.01)
  *H01R 13/46*  (2006.01)
  *H01R 31/08*  (2006.01)

(52) U.S. Cl.
  CPC .......... *H01R 13/46* (2013.01); *H01R 31/08* (2013.01); *B60R 16/0207* (2013.01); *H01R 2201/26* (2013.01)

(56) References Cited

U.S. PATENT DOCUMENTS

| | | | | |
|---|---|---|---|---|
| 5,470,253 A * | 11/1995 | Siems | B60R 16/0207 | 439/932 |
| 5,590,011 A * | 12/1996 | Hein | H01R 31/08 | 361/103 |
| 5,613,857 A * | 3/1997 | Kawamura | B60R 16/0207 | 439/519 |
| 5,787,574 A * | 8/1998 | Watanabe | H02G 1/1256 | 81/9.51 |
| 5,867,896 A * | 2/1999 | Watanabe | H01R 43/28 | 81/9.51 |
| 5,971,799 A * | 10/1999 | Swade | H01R 27/02 | 439/502 |
| 6,153,975 A * | 11/2000 | Perdec | B60R 16/0207 | 307/10.1 |
| 6,246,001 B1 * | 6/2001 | Fukui | H01R 9/0512 | 174/78 |
| 6,478,585 B2 * | 11/2002 | Yuasa | H01R 9/2458 | 439/732 |
| 6,503,098 B2 * | 1/2003 | Aoki | B60R 16/0207 | 439/502 |
| 6,744,540 B1 * | 6/2004 | Masuda | H04N 1/00779 | 358/461 |
| 7,059,889 B1 * | 6/2006 | Pavlovic | H01R 4/2429 | 439/417 |
| 8,235,736 B2 * | 8/2012 | Watanabe | H01R 13/6591 | 439/108 |
| 2002/0023771 A1 * | 2/2002 | Gerencir | H01R 4/186 | 174/88 R |
| 2002/0048991 A1 * | 4/2002 | France | H01R 13/6273 | 439/587 |
| 2002/0048994 A1 * | 4/2002 | Oota | H01R 9/24 | 439/98 |
| 2002/0170729 A1 * | 11/2002 | Murakami | H01B 9/028 | 174/394 |
| 2003/0143898 A1 * | 7/2003 | Aoyama | H01R 4/64 | 439/877 |
| 2005/0277335 A1 * | 12/2005 | Gordon | H01R 13/6589 | 439/607.48 |
| 2009/0126993 A1 * | 5/2009 | Nishimura | H02G 1/14 | 156/48 |
| 2009/0305568 A1 * | 12/2009 | Ambo | H01R 31/08 | 439/889 |
| 2009/0314511 A1 * | 12/2009 | Hagi | H01R 9/0512 | 174/78 |
| 2011/0294317 A1 * | 12/2011 | Nishio | H01R 11/12 | 439/95 |
| 2012/0009821 A1 * | 1/2012 | Watanabe | H01R 13/6591 | 439/626 |
| 2012/0071015 A1 * | 3/2012 | Debock | H01R 12/775 | 439/271 |
| 2012/0103648 A1 * | 5/2012 | Ogura | H01B 7/0045 | 174/34 |
| 2013/0032395 A1 * | 2/2013 | Smoll | H01R 43/005 | 29/874 |
| 2013/0059469 A1 * | 3/2013 | Kawakita | H02G 15/046 | 156/185 |
| 2013/0115809 A1 * | 5/2013 | Hanson | H01R 13/6591 | 439/578 |
| 2014/0209345 A1 * | 7/2014 | Minadeo | H01R 4/72 | 174/84 R |
| 2014/0238741 A1 * | 8/2014 | Willing | H01R 43/20 | 174/84 R |
| 2014/0287621 A1 * | 9/2014 | Smutny | H01R 31/08 | 439/658 |
| 2014/0332250 A1 * | 11/2014 | Diaz Ortega | H01B 11/105 | 174/102 R |
| 2015/0162692 A1 * | 6/2015 | Jones | H01R 24/28 | 439/660 |
| 2016/0064120 A1 * | 3/2016 | Wakabayashi | H01B 7/0045 | 174/72 A |
| 2016/0087414 A1 * | 3/2016 | Satoh | B60R 16/0207 | 174/72 A |
| 2016/0336094 A1 * | 11/2016 | Omura | H01B 7/1855 | |
| 2016/0347269 A1 * | 12/2016 | Breed | B60R 16/0215 | |
| 2017/0012373 A1 * | 1/2017 | Nonen | H01B 3/30 | |
| 2017/0076836 A1 * | 3/2017 | Huber | H01B 7/0009 | |
| 2017/0264064 A1 * | 9/2017 | Matsui | B60R 16/0207 | |
| 2017/0370026 A1 * | 12/2017 | Perera | H05K 9/0088 | |
| 2018/0339667 A1 * | 11/2018 | Hiramitsu | B60R 16/0215 | |
| 2018/0342334 A1 * | 11/2018 | Sugimoto | H01B 7/0045 | |
| 2018/0366841 A1 * | 12/2018 | Ikeya | C22C 5/06 | |
| 2019/0027908 A1 * | 1/2019 | Kawaguchi | H01R 13/648 | |
| 2019/0239398 A1 * | 8/2019 | Mizuno | H05K 9/0088 | |
| 2019/0273329 A1 * | 9/2019 | Fukami | B60R 16/0207 | |
| 2019/0288416 A1 * | 9/2019 | Wimmer | H01R 13/6593 | |
| 2020/0021000 A1 * | 1/2020 | Shimizu | H01B 7/0045 | |
| 2020/0113070 A1 * | 4/2020 | Watanabe | H05K 5/0047 | |
| 2020/0282928 A1 * | 9/2020 | Murata | H01B 7/17 | |
| 2021/0050131 A1 * | 2/2021 | Endo | H01B 7/1805 | |
| 2022/0094115 A1 * | 3/2022 | Nozawa | H01R 13/6591 | |
| 2023/0048710 A1 * | 2/2023 | Bardella | H01R 13/65914 | |
| 2023/0049348 A1 * | 2/2023 | Sugahara | H01B 7/0045 | |

FOREIGN PATENT DOCUMENTS

| | | |
|---|---|---|
| JP | H08-007944 A | 1/1996 |
| JP | H11-087008 A | 3/1999 |
| JP | 2010-243206 A | 10/2010 |
| JP | 2016-112625 A | 6/2016 |
| KR | 10-2016-0073149 A | 6/2016 |

* cited by examiner

WIRE HARNESS INCLUDING CONNECTOR HAVING VACANT CAVITY

CROSS REFERENCE TO RELATED APPLICATIONS

This application is a national phase of PCT application No. PCT/JP2021/000260, filed on 7 Jan. 2021, which claims priority from Japanese patent application No. 2020-006542, filed on 20 Jan. 2020, all of which are incorporated herein by reference.

TECHNICAL FIELD

The present disclosure relates to a wire harness.

BACKGROUND

For example, in the wire harness disclosed in Patent Document 1, an electric wire is covered by a shielding member (a conductive layer in Patent Document 1) constituted by a conductive body, and a drain wire that is in electrical continuity with the shielding member is inserted into a cavity of a connector provided at an end portion of the wire harness. The drain wire inserted into the cavity of the connector is electrically connected to a terminal provided in the cavity, and the same terminal is connected to a terminal of a partner connector that is connected to the connector of the wire harness. In a configuration such as that disclosed in Patent Document 1, the drain wire is connected to the connector, and thus a continuity test can be performed on the shielding member including the drain wire, via the connector.

PRIOR ART DOCUMENT

Patent Document

Patent Document 1: JP H11-087008 A

SUMMARY OF THE INVENTION

Problems to be Solved

Unlike Patent Document 1, when a configuration in which a shielding member is not electrically connected to a partner connector is used, it is common practice to not provide a cavity for a drain wire in a connector and to also omit the drain wire for connection to a partner connector. However, in this case, there is the issue of being unable to perform a continuity test on the shielding member via the connector.

Thus it is an object of the present invention to provide a wire harness in which a continuity test can be performed on a shielding member in a configuration where the shielding member is not electrically connected to a partner connector.

Means to Solve the Problem

A wire harness of the present disclosure including: an electric wire; a connector that is connected to one end portion of the electric wire; a tubular shielding member covering the electric wire; and a drain wire that is in electrical continuity with the shielding member, and is drawn out from an end portion of the shielding member on the connector side, wherein the drain wire is inserted into a vacant cavity of the connector.

Also, the wire harness of the present disclosure including: a first wire harness that includes a first electric wire, a tubular first shielding member covering the first electric wire, a pair of drain wires that are respectively drawn out from two end portions in a longitudinal direction of the first shielding member, and a first connector that is provided at one end portion of the first electric wire; a second wire harness that includes a second electric wire, a tubular second shielding member covering the second electric wire, a pair of drain wires that are respectively drawn out from two end portions in a longitudinal direction of the second shielding member, and a second connector that is provided at one end portion of the second electric wire; and a connection member electrically connecting one drain wire of the pair of drain wires of the first wire harness that is drawn out from the end portion of the first shielding member on the opposite side to the first connector, and one drain wire of the pair of drain wires of the second wire harness that is drawn out from the end portion of the second shielding member on the opposite side to the second connector, wherein the other drain wire of the pair of drain wires of the first wire harness that is drawn out from the end portion of the first shielding member on the first connector side is grounded, and the other drain wire of the pair of drain wires of the second wire harness that is drawn out from the end portion of the second shielding member on the second connector side is inserted into a vacant cavity of the second connector.

Effect of the Invention

With the present disclosure, a wire harness can be provided in which a continuity test can be performed on a shielding member in a configuration where the shielding member is not electrically connected to a partner connector.

DETAILED DESCRIPTION TO EXECUTE THE INVENTION

Description of Embodiments of Present Disclosure

Figure 1:
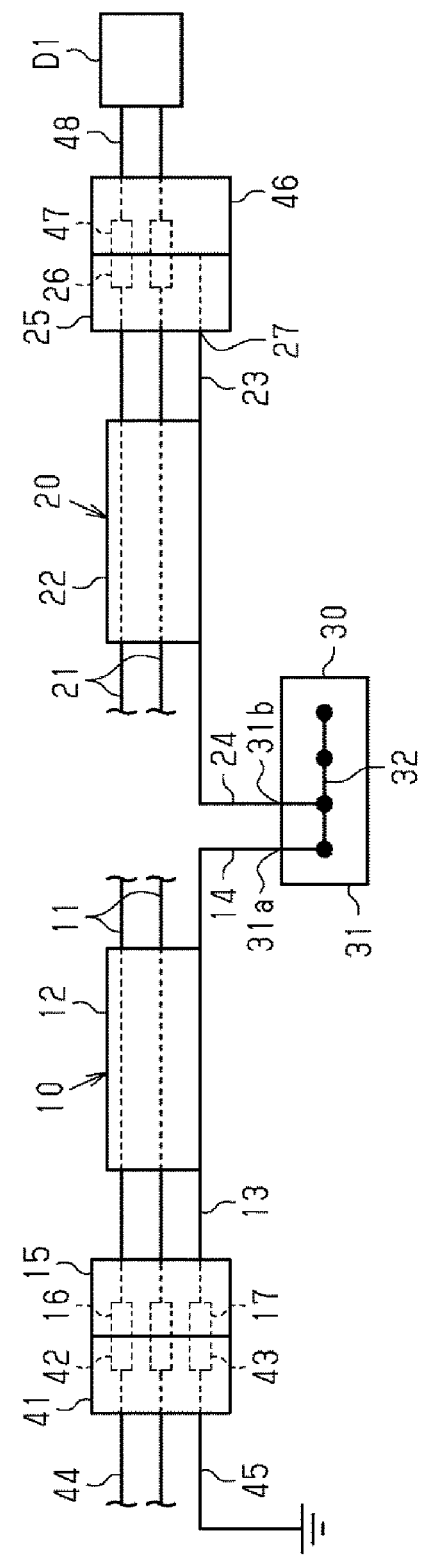
FIG. 1 is a schematic configuration diagram of a wire harness according to an embodiment.

First, embodiments of the present disclosure will be listed and described below.

[1] A wire harness of the present disclosure including an electric wire; a connector that is connected to one end portion of the electric wire; a tubular shielding member covering the electric wire; and a drain wire that is in electrical continuity with the shielding member, and is drawn out from an end portion of the shielding member on the connector side, wherein the drain wire is inserted into a vacant cavity of the connector.

With this configuration, the drain wire that is electrically connected to the shielding member is inserted into the vacant cavity of the connector of the wire harness, and thus a continuity test can be performed on the shielding member via the connector. Here, the vacant cavity of the connector is a cavity for which a corresponding terminal does not exist in a partner connector that is connected to the connector.

[2] Also, a wire harness of the present disclosure including a first wire harness that includes a first electric wire, a tubular first shielding member covering the first electric wire, a pair of drain wires that are respectively drawn out from two end portions in a longitudinal direction of the first shielding member, and a first connector that is provided at one end portion of the first electric wire; a second wire harness that includes a second electric wire, a tubular second shielding member covering the second electric wire, a pair of drain wires that are respectively drawn out from two end portions in a longitudinal direction of the second shielding member, and a second connector that is provided at one end portion of the second electric wire; and a connection member electrically connecting one drain wire of the pair of drain wires of the first wire harness that is drawn out from the end portion of the first shielding member on the opposite side to the first connector, and one drain wire of the pair of drain wires of the second wire harness that is drawn out from the end portion of the second shielding member on the opposite side to the second connector, wherein the other drain wire of the pair of drain wires of the first wire harness that is drawn out from the end portion of the first shielding member on the first connector side is grounded, and the other drain wire of the pair of drain wires of the second wire harness that is drawn out from the end portion of the second shielding member on the second connector side is inserted into a vacant cavity of the second connector.

With this configuration, a drain wire electrically connected to the second shielding member is inserted into the vacant cavity of the second connector, and thus a continuity test can be performed on the first shielding member and the second shielding member via the second connector. Here, the vacant cavity of the second connector is a cavity for which a corresponding terminal does not exist in a partner connector connected to the second connector.

[3] It is preferable that, of the pair of drain wires of the first wire harness, the other drain wire drawn out from the end portion of the first shielding member on the first connector side is connected to the first connector.

With this configuration, a continuity test can be performed on the first shielding member and the second shielding member via the first connector and the second connector.

[4] It is preferable that the connection member is a splice part.

With this configuration, even if a splice part that is not suitable for continuity testing is used for the connection member that connects the first shielding member and the second shielding member, a continuity test can still be performed on the first shielding member and the second shielding member.

[5] It is preferable that he wire harness includes: a third wire harness that includes a third electric wire, a tubular third shielding member covering the third electric wire, a pair of drain wires that are respectively drawn out from two end portions in a longitudinal direction of the third shielding member, and a third connector that is provided at one end portion of the third electric wire, wherein one drain wire of the pair of drain wires of the third wire harness, which is drawn out from the end portion of the third shielding member on the opposite side to the third connector, is electrically connected to the first shielding member and the second shielding member via the connection member, and the other drain wire of the pair of drain wires of the third wire harness that is drawn out from the end portion of the third shielding member on the third connector side is inserted into a vacant cavity separate from the vacant cavity of the second connector.

With this configuration, even if a vacant cavity is not provided in the third connector of the third wire harness, a continuity test can be performed on the third shielding member via the second connector.

Detailed Description of Embodiment of the Present Disclosure

Specific examples of a wire harness of the present disclosure will be described below with reference to the drawings. Note that the present disclosure is not limited to these illustrative examples, but is indicated by the claims, and all changes that come within the meaning and range of equivalency of the claims are intended to be embraced therein.

As shown in FIG. 1, a vehicle wire harness W according to the present embodiment includes a first wire harness 10 and a second wire harness 20. Also, the wire harness W includes a connection member 30 for electrically connecting a drain wire 14 of the first wire harness 10 and a drain wire 24 of the second wire harness 20 to each other.

(First Wire Harness 10)

The first wire harness 10 includes a plurality of first electric wires 11, a tubular first shielding member 12 that collectively covers the first electric wires 11, a pair of drain wires 13 and 14 respectively drawn from two end portions in the longitudinal direction of the first shielding member 12, and a first connector 15 that is provided at one end portion of the first electric wires 11.

The first shielding member 12 can be, for example, a tubular member in which a metal foil is rolled into a tubular shape or a metal braided member formed by braiding metal strands into a tubular shape. Note that the outer circumference of the first shielding member 12 is covered by a tubular exterior member (not shown). The drain wires 13 and 14 are electrically connected to the first shielding member 12.

One end portion of each first electric wire 11 is inserted into the first connector 15, and connected to a terminal 16 provided in the first connector 15. Also, the other end portion of each first electric wire 11 is connected to a device (not shown) mounted to the vehicle.

The first connector 15 is a so-called wire-to-wire type connector. The terminals 16 in the first connector 15 are respectively connected to terminals 42 in a partner connector 41 that is connected to the first connector 15. The terminals 42 of the partner connector 41 are respectively connected to electric wires 44 that are joined to an un-shown device mounted to the vehicle.

The drain wire 13 of the pair of drain wires 13 and 14 is inserted into the first connector 15 and connected to a terminal 17 provided in the first connector 15. The terminal 17 of the first connector 15 is connected to a terminal 43 of the partner connector 41 that is connected to the first connector 15. An electric wire 45 that is connected to the terminal 43 of the partner connector 41 is grounded to the vehicle body, an earth terminal, or the like.

(Second Wire Harness 20)

The second wire harness 20 includes a plurality of second electric wires 21, a tubular second shielding member 22 that collectively covers the second electric wires 21, a pair of drain wires 23 and 24 respectively drawn from two end portions in the longitudinal direction of the second shielding member 22, and a second connector 25 that is provided at one end portion of the second electric wires 21.

The second shielding member 22 can be, for example, a tubular member in which a metal foil is rolled into a tubular shape or a metal braided member formed by braiding metal strands into a tubular shape. Note that the outer circumference of the second shielding member 22 is covered by a tubular exterior member (not shown). The drain wires 23 and 24 are electrically connected to the second shielding member 22.

One end portion of each second electric wire 21 is inserted into the second connector 25, and connected to a terminal 26 provided in the second connector 25. Also, the other end portion of each second electric wire 21 is connected to a device (not shown) mounted to the vehicle.

The second connector 25 is a so-called wire-to-wire type connector. The terminals 26 in the second connector 25 are respectively connected to terminals 47 in a partner connector 46 that is connected to the second connector 25. The terminals 47 of the partner connector 46 are respectively connected to electric wires 48 that are joined to a device D1 mounted to the vehicle.

The drain wire 23 of the pair of drain wires 23 and 24 is inserted into a vacant cavity 27 in the second connector 25. The partner connector 46 connected to the second connector 25 is not provided with a terminal that corresponds to the vacant cavity 27 in the second connector 25. Also, no terminal is provided in the vacant cavity 27 of the present embodiment.

(Connection Member 30)

The connection member 30 is a component that is referred to as a splice part, and includes a metal terminal 32 inside a housing 31 thereof. The drain wire 14 of the first shielding member 12 and the drain wire 24 of the second shielding member 22 are inserted into the housing 31 and connected to the metal terminal 32. Thus, the drain wires 14 and 24 are electrically connected to each other via the metal terminal 32.

Here, a difference between the connection member 30 serving as a splice part and a joint connector 60 different from the connection member 30 serving as a splice part will be described.

Figure 4:
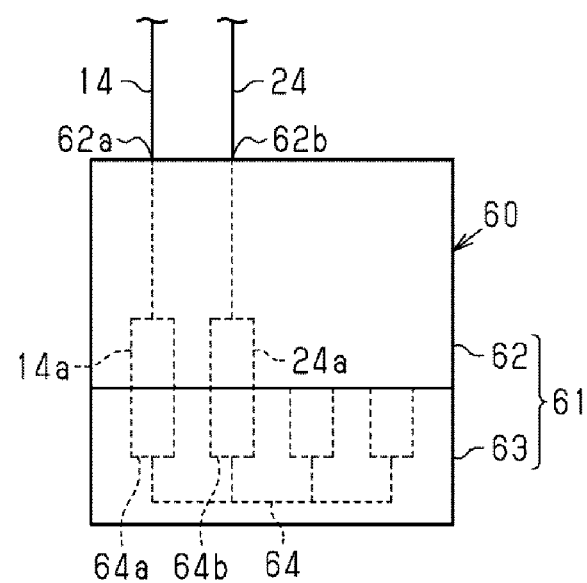
FIG. 4 is a schematic diagram of a joint connector.

FIG. 4 shows an example of a configuration in which the joint connector 60 is used in placed of the connection member 30 of the embodiment. A housing 61 of the joint connector 60 is constituted by at least two components, namely a connector housing 62 and a terminal-equipped housing 63. The terminal-equipped housing 63 is configured to be detachably attached to the connector housing 62.

The connector housing 62 has a plurality of cavities, and the drain wire 14 of the first shielding member 12 and the drain wire 24 of the second shielding member 22 are respectively inserted into a cavity 62a and a cavity 62b of the cavities. On the other hand, the terminal-equipped housing 63 is internally provided with a metal terminal 64 that integrally includes a first terminal portion 64a and a second terminal portion 64b.

In a state where the terminal-equipped housing 63 is installed to the connector housing 62, a terminal 14a provided at the leading end of the drain wire 14 and disposed in the cavity 62a is connected to the first terminal portion 64a of the metal terminal 64. Also, in a state where the terminal-equipped housing 63 is installed to the connector housing 62, a terminal 24a provided at the leading end of the drain wire 24 and disposed in the cavity 62b is connected to the second terminal portion 64b of the metal terminal 64. That is, in this state, the drain wires 14 and 24 are electrically connected to each other via the metal terminal 64 of the terminal-equipped housing 63. On the other hand, in a state where the connector housing 62 is removed from the terminal-equipped housing 63, the connection state of the terminals 14a and 24a realized by the metal terminal 64 is released, and the drain wires 14 and 24 are no longer electrically connected to each other.

The connection member 30 constituted by a splice part such as that described in the present embodiment, which differs from the aforementioned joint connector 60, is provided with cavities 31a and 31b into which the drain wires 14 and 24 are respectively inserted in the housing 31 that houses the metal terminal 32 that allows a current to pass through the drain wires 14 and 24, as shown in FIG. 1. Thus, in comparison to the joint connector 60, the splice part is advantageous in terms of reducing the size of and simplifying the configuration of the connection member 30.

Operation of the present embodiment will be described.

Figure 2:
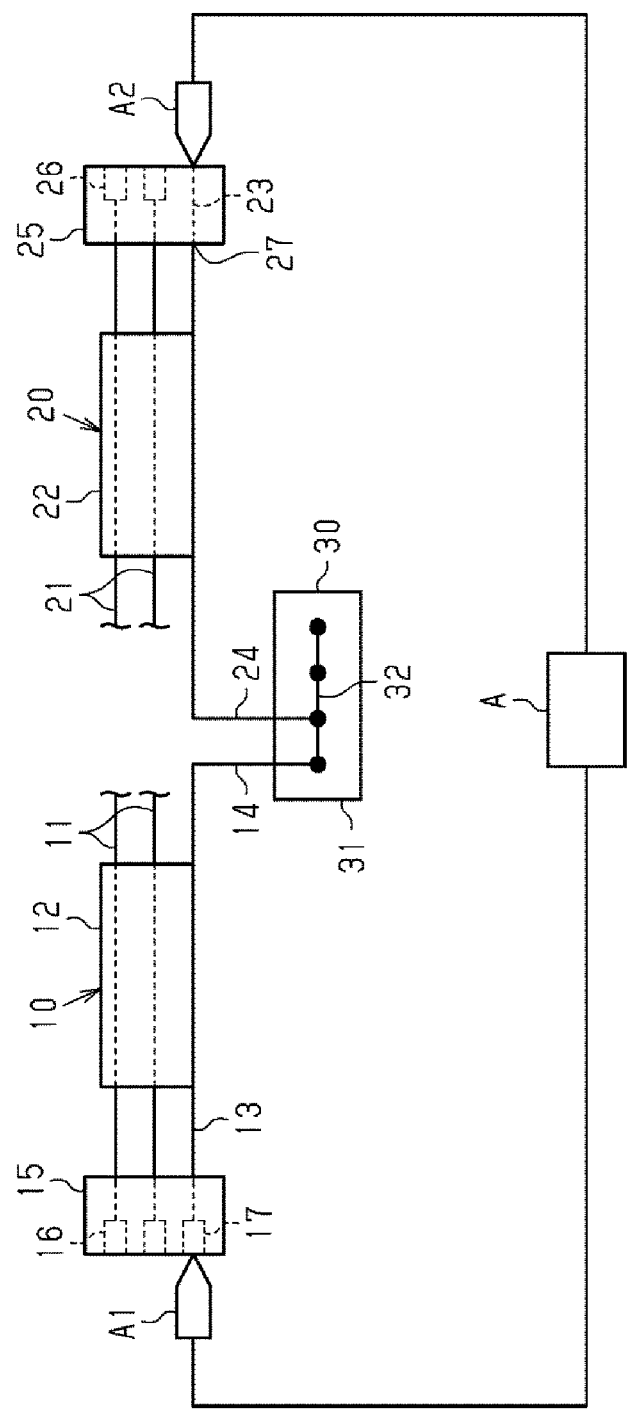
FIG. 2 is a descriptive diagram for describing how a continuity test is performed on a shielding member according to the embodiment.

FIG. 2 shows how a continuity test is performed on the first shielding member 12 and the second shielding member 22. As shown in FIG. 2, a galvanometer A including a first terminal A1 and a second terminal A2 is used in the continuity test performed on the first shielding member 12 and the second shielding 22. The first connector 15 is not connected to the partner connector 41 during the continuity test. Also, the second connector 25 is not connected to the partner connector 46 during the continuity test.

The first terminal A1 connected to the galvanometer A is inserted into the cavity of the first connector 15 that houses the terminal 17 connected to the drain wire 13 of the first shielding member 12 to bring the first terminal A1 into contact with the terminal 17. Also, the second terminal A2 connected to the galvanometer A is inserted into the vacant cavity 27 of the second connector 25 that houses the drain wire 23 of the second shielding member 22 to bring the second terminal A2 into contact with the drain wire 23. Accordingly, a test can be performed using the galvanometer A to see whether a current can properly flow through a circuit including the first shielding member 12 and the second shielding member 22.

Effects of the present embodiment will be described.

(1) The drain wire 23 drawn out from the end portion of the second shielding member 22 on the second connector 25 side is inserted into the vacant cavity 27 of the second connector 25. With this configuration, the drain wire 23 that is electrically continuous with the second shielding member 22 is inserted into the vacant cavity 27 of the second connector, and thus a continuity test can be performed on the first shielding member 12 and the second shielding member 22 via the second connector. Here, the vacant cavity 27 of the second connector is a cavity for which a corresponding terminal does not exist in the partner connecter connected to the second connector.

(2) The drain wire 13 drawn out from the end portion of the first shielding member 12 on the first connector 15 side is connected to the first connector 15. With this configuration, a continuity test can be performed on the first shielding member 12 and the second shielding member 22 via the first connector 15 and the second connector.

(3) A splice part is employed for the connecting member 30 that connects the first shielding member 12 and the second shielding member 22. In comparison with the joint connector 60, the splice part is advantageous in terms of reducing size, but it is difficult to bring a terminal of a galvanometer into contact with the drain wires 14 and 24 in the housing 31. However, as is the case with the present embodiment, if a configuration is employed where the drain wire 23 of the second shielding member 22 is inserted into the vacant cavity 27 of the second connector 25, even if a splice part that is not suitable for continuity testing is used for the connection member 30, a continuity test can be performed on the first shielding member 12 and the second shielding member 22.

The following modifications can be made to the present embodiment and implemented. The present embodiment and the following modifications can be combined and implemented provided that no technical contradiction arises.

Figure 3:
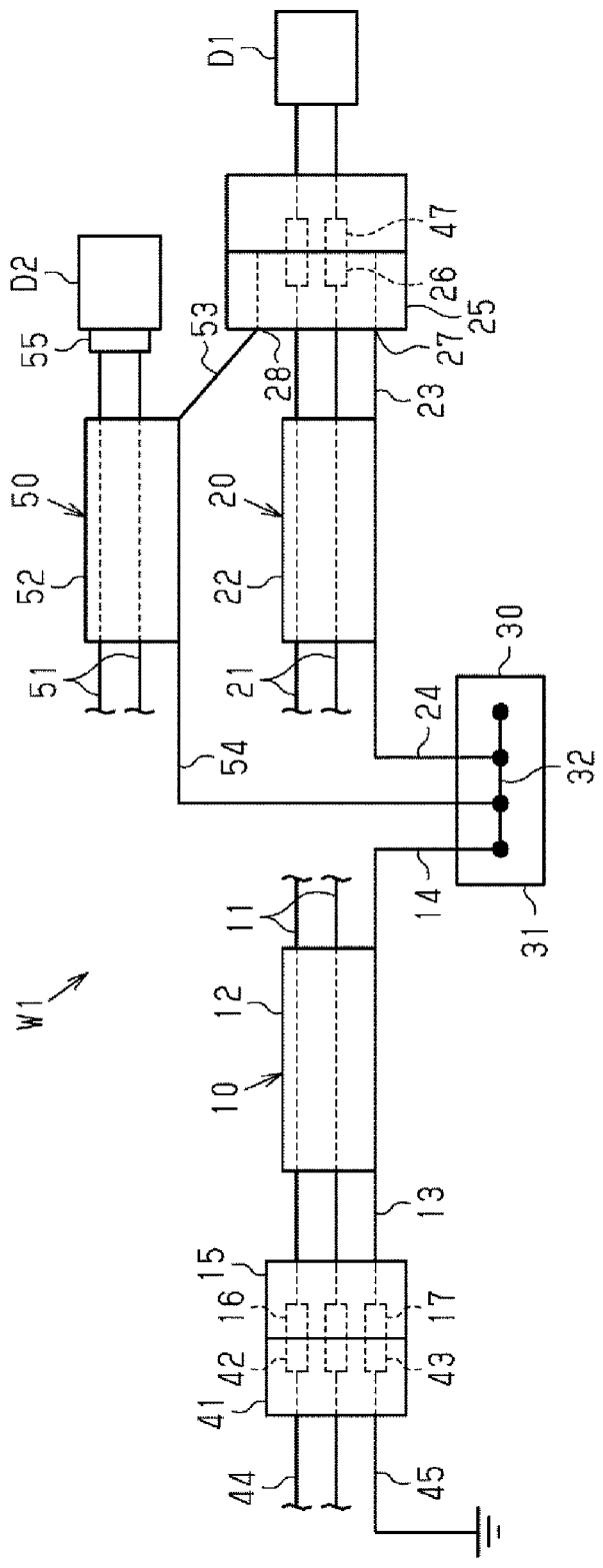
FIG. 3 is a schematic configuration diagram of a wire harness according to a modification.

The present embodiment may be changed to a configuration such as that of a wire harness W1 shown in FIG. 3. Note that, in the description of the configuration of the wire harness W1 shown in FIG. 3, the same or similar configurations to those of the embodiment are given the same or similar reference numerals to those of the embodiment, and description thereof will be omitted.

The vehicle wire harness W1 shown in FIG. 3 includes the first wire harness 10, the second wire harness 20, and a third wire harness 50. Also, the wire harness W1 includes the connection member 30 for electrically connecting the drain wire 14 of the first wire harness 10, the drain wire 24 of the second wire harness 20, and a drain wire 54 of the third wire harness 50 to each other.

The first wire harness 10 has a similar configuration to that of the embodiment.

The second wire harness 20 has a similar configuration to that of the embodiment. The second connector 25 of the second wire harness 20 includes at least two vacant cavities 27 and 28. The partner connector 46 connected to the second connector 25 is not provided with terminals that correspond to the vacant cavities 27 and 28 of the second connector 25, and neither of the vacant cavities 27 and 28 of the second connector 25 are provided with terminals.

The third wire harness 50 includes a plurality of third electric wires 51, a tubular third shielding member 52 that collectively covers the third electric wires 51, a pair of drain wires 53 and 54 respectively drawn from two end portions in the longitudinal direction of the third shielding member 52, and a third connector 55 that is provided at one end portion of the third electric wires 51.

The third shielding member 52 can be, for example, a tubular member in which a metal foil is rolled into a tubular shape or a metal braided member formed by braiding metal strands into a tubular shape. Note that the outer circumference of the third shielding member 52 is covered by a tubular exterior member (not shown). The drain wires 53 and 54 are electrically connected to the third shielding member 52.

One end portion of each third electric wire 51 is connected to a device D2 mounted to the vehicle, via the third connector 55. The third connector 55 is a connector that is connected to a connection portion of a connector of the device D2, and is not provided with a vacant cavity such as those provided in the second connector 25.

One drain 53 of the third wire harness 50 is inserted into the vacant cavity 28 of the second connector 25. That is, the second connector 25 includes the vacant cavity 27 into which the drain wire 23 of the same system is inserted, and the vacant cavity 28 into which the drain wire 53 of the third wire harness 50 of a separate system is inserted. Note that the third shielding member 52 and the second shielding member 22 are disposed at positions close to each other.

In the wire harness W1, the drain wire 14 of the first shielding member 12, the drain wire 24 of the second shielding member 22, and the drain wire 54 of the third shielding member 52 are inserted into the housing 31 of the connection member 30, and connected to the metal terminal 32 in the housing 31. Accordingly, the drain wires 14, 24, and 54 are electrically connected to each other via the metal terminal 32.

A continuity test performed on the first shielding member 12, the second shielding member 22, and the third shielding member 52 in the wire harness W1 will be described. The same galvanometer A (see FIG. 2) as that in the above embodiment is used for the continuity test. At the time of the continuity test, the first connector 15 is not connected to the partner connector 41 and the second connector 25 is not connected to the partner connector 46.

The first terminal A1 connected to the galvanometer A is inserted into a cavity of the first connector 15 housing the terminal 17 connected to the drain wire 13 of the first shielding member 12 to bring the first terminal A1 into contact with the terminal 17. Also, the second terminal A2 connected to the galvanometer A is inserted into the vacant cavity 27 of the second connector 25 housing the drain wire 23 of the second shielding member 22 to bring the second terminal A2 into contact with the drain wire 23. Accordingly, a test can be performed using the galvanometer A to see whether a current can properly flow through a circuit including the first shielding member 12 and the second shielding member 22.

Also, the first terminal A1 connected to the galvanometer A is inserted into a cavity of the first connector 15 housing the terminal 17 connected to the drain wire 13 of the first shielding member 12 to bring the first terminal A1 into contact with the terminal 17. Also, the second terminal A2 connected to the galvanometer A is inserted into the vacant cavity 28 of the second connector 25 that houses the drain wire 53 of the third shielding member 52 to bring the second terminal A2 into contact with the drain wire 53. Accordingly, a test can be performed using the galvanometer A to see whether a current can properly flow through a circuit including the first shielding member 12 and the third shielding member 52.

With this configuration, the drain wire 53 drawn out from the end portion of third shielding member 52 on the third connector 55 side is inserted into the vacant cavity 28 of the second connector 25 that is separate from the vacant cavity 27 into which the drain wire 23 of the second shielding member 22 is inserted. Accordingly, even if a vacant cavity is not provided in the third connector 55 of the third wire harness 50, a continuity test can be performed on the third shielding member 52 via the second connector 25.

The wire harness W of the embodiment may include a terminal that is attached to the leading end of the drain wire 23 and disposed inside the vacant cavity 27. Accordingly, a configuration is realized in which the second terminal A2 of the galvanometer A facilitates the passage of a current through the drain wire 23. Similarly, the wire harness W1 with the configuration shown in FIG. 3 may include terminals that are respectively attached to the leading ends of the drain wires 23 and 53 and arranged inside the vacant cavities 27 and 28.

In the embodiment, the connection member 30 was a splice part, but there is no limitation to this, and the joint connector 60 may be used in place of the connection member 30.

In the above embodiment, the wire harness W includes a plurality of wire harnesses (first wire harness 10 and second wire harness 20), but another configuration in which the wire harness W only includes the wire harness 20 is also applicable. In this case, the drain wire 24 of the second shielding member 22 is grounded.

As shown in FIGS. 1 to 3, the vacant cavity 27 of the second connector 25 may be a through passage or a through hole that passes through the second connector 25. As shown in FIGS. 1 to 3, the second cavity 25 may have a connection end face that opposes, comes into contact with, or abuts against the partner connector 46. As shown in FIG. 2, the second terminal A2 of the galvanometer A may be able to access the drain wire 23 in the vacant cavity 27 from the connection end face of the second cavity 25.

LIST OF REFERENCE NUMERALS

W Wire harness
10 First wire harness
11 First electric wire
12 First shielding member
13 Drain wire
14 Drain wire
14a Terminal
15 First connector
16 Terminal
17 Terminal
20 Second wire harness
21 Second electric wire (electric wire)
22 Second shielding member (shielding member)
23 Drain wire
24 Drain wire
24a Terminal
25 Second connector (connector)
26 Terminal
27 Vacant cavity
28 Vacant cavity
30 Connection member (splice part)
31 Housing
31a Cavity
31b Cavity
32 Metal terminal
41 Partner connector
42 Terminal
43 Terminal
44 Electric wire
45 Electric wire
46 Partner connector
47 Terminal
48 Electric wire
A Galvanometer
A1 First terminal
A2 Second terminal
D1 Device
D2 Device
W1 Wire harness
50 Third wire harness
51 Third electric wire
52 Third shielding member
53 Drain wire
54 Drain wire
55 Third connector
60 Joint connector
61 Housing
62 Connector housing
62a Cavity
62b Cavity
63 Terminal-equipped housing
64 Metal terminal
64a First terminal portion
64b Second terminal portion

What is claimed is:

1. A wire harness comprising:
an electric wire;
a connector that is connected to one end portion of the electric wire;
a shielding member having a tubular shape and configured to cover the electric wire; and
a drain wire having electrical continuity with the shielding member and drawn out from an end portion of the shielding member on a side of the connector,
wherein the drain wire is inserted into a vacant cavity of the connector in which no connection terminal is provided.

2. A wire harness comprising:
a first wire harness that includes a first electric wire, a first shielding member having a tubular shape and configured to cover the first electric wire, a pair of drain wires that are respectively drawn out from two end portions in a longitudinal direction of the first shielding member, and a first connector that is provided at one end portion of the first electric wire;
a second wire harness that includes a second electric wire, a second shielding member having a tubular shape and configured to cover the second electric wire, a pair of drain wires that are respectively drawn out from two end portions in a longitudinal direction of the second shielding member, and a second connector that is provided at one end portion of the second electric wire; and
a connection member electrically connecting one of the pair of drain wires of the first wire harness that is drawn out from the end portion of the first shielding member on an opposite side to the first connector, and one of the pair of drain wires of the second wire harness that is drawn out from the end portion of the second shielding member on an opposite side to the second connector,
wherein a remaining one of the pair of drain wires of the first wire harness that is drawn out from the end portion of the first shielding member on the first connector side is grounded, and
a remaining one of the pair of drain wires of the second wire harness that is drawn out from the end portion of the second shielding member on the second connector side is inserted into a vacant cavity of the second connector.

3. The wire harness according to claim 2,
wherein, among the pair of drain wires of the first wire harness, the remaining one of the pair of drain wires of the first wire harness is connected to the first connector.

4. The wire harness according to claim 2,
wherein the connection member is a splice part.

5. The wire harness according to claim 2, comprising:
a third wire harness that includes a third electric wire, a third shielding member having a tubular shape and configured to cover the third electric wire, a pair of drain wires that are respectively drawn out from two end portions in a longitudinal direction of the third shielding member, and a third connector that is provided at one end portion of the third electric wire,
wherein one of the pair of drain wires of the third wire harness, which is drawn out from the end portion of the third shielding member on an opposite side to the third connector, is electrically connected to the first shielding member and the second shielding member via the connection member, and a remaining one of the pair of drain wires of the third wire harness that is drawn out from the end portion of the third shielding member on the third connector side is inserted into a vacant cavity separate from the vacant cavity of the second connector.

* * * * *